United States Patent [19]
Dinsmore et al.

[11] Patent Number: 5,608,320
[45] Date of Patent: *Mar. 4, 1997

[54] MIRROR IMAGE DIFFERENTIAL INDUCTION AMPLITUDE MAGNETOMETER

[75] Inventors: Robert C. Dinsmore, Flint; Kelvin Shih, Brighton, both of Mich.

[73] Assignee: Dinsmore Instrument Company, Flint, Mich.

[*] Notice: The term of this patent shall not extend beyond the expiration date of Pat. No. 5,432,445.

[21] Appl. No.: 500,569

[22] Filed: Jul. 11, 1995

Related U.S. Application Data

[63] Continuation of Ser. No. 918,963, Jul. 24, 1992, Pat. No. 5,432,445.

[51] Int. Cl.$^6$ .................................................. G01R 33/04
[52] U.S. Cl. ............................................................ 324/253
[58] Field of Search ...................................... 324/253, 254, 324/255

[56] References Cited

U.S. PATENT DOCUMENTS 5,432,445   7/1995   Dinsmore et al. ...................... 324/253

*Primary Examiner*—Walter E. Snow
*Attorney, Agent, or Firm*—MacMillan, Sobanski & Todd

[57] ABSTRACT

Provided is a magnetomoter apparatus for measuring low-level magnetic fields. The magnetometer utilizes a coil-pair wound on cores of a high permeability material. These coils are driven to magnetic saturation by an energizing circuit, and develop a uniquely shaped distortion spike in their back emf having an amplitude which is directly related to the ambient magnetic field. The resulting back emf of the coils can be compared and processed to generate a measurement of the ambient magnetic field.

17 Claims, 4 Drawing Sheets

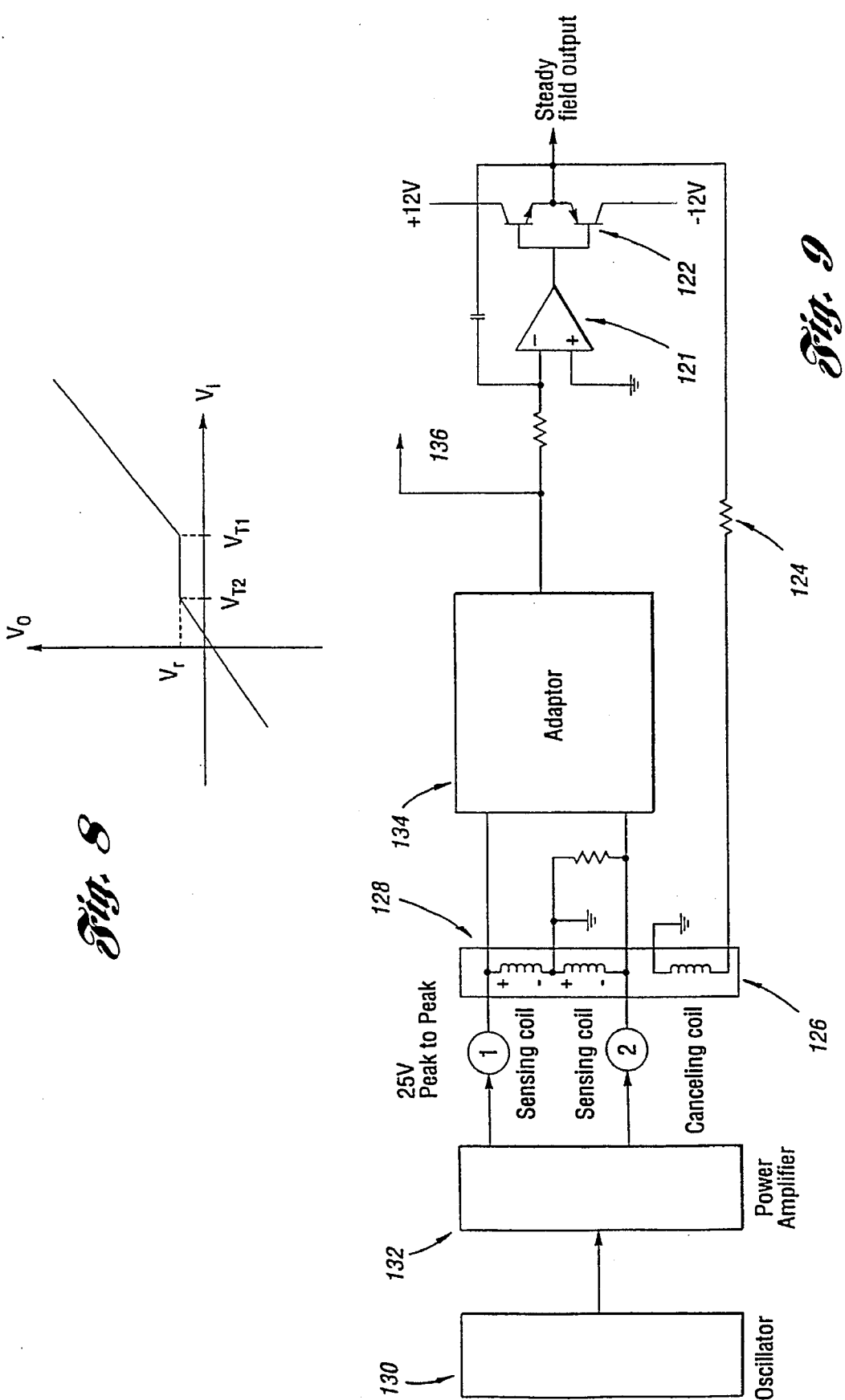

MIRROR IMAGE DIFFERENTIAL INDUCTION AMPLITUDE MAGNETOMETER

CROSS-REFERENCE TO PRIOR APPLICATION

This application is a continuation of U.S. patent application Ser. No. 07/918,963 filed on Jul. 24, 1992, now U.S. Pat. No. 5,432,445.

TECHNICAL FIELD

This invention relates to an apparatus and sensors used for measuring magnetic fields.

BACKGROUND ART

Sensors which measure the strength of a magnetic field are referred to as magnetometers. Magnetometers are used in many scientific disciplines which rely upon the application of magnetometry including: biology, physiology, geology, and oceanography. Magnetometers are used commercially for the construction of dipping needles, pipeline locators, buried mine locators, bore hole controls, mineral lode indicators, and similar devices. Further, magnetometers are used in medical devices such as MRI scanners which chart the interior of the body. As potential applications of magnetometry have increased, so have the requirements for increased sensitivity magnetometers.

Many different types of magnetometers are well known to those skilled in the art. Examples of these devices include Hall effect devices, fluxgate devices and classical Gauss and sine galvanometers. Once such device is disclosed in U.S. Pat. No. 4,402,142 to Dinsmore. This patent teaches the use of a Hall effect sensor in a compass.

Standard magnetometers are not adequate for the measurement of low level magnetic fields in the range of one nano Tesla (1 nT) or smaller. Currently, there are only a few specially designed magnetometers which are capable of measuring magnetic fields at this low level.

One of these magnetometers, the proton precession or Larmor magnetometer has a sensitivity in the 1 nano Tesla range. This device depends on the random magnetic resonance measurements in a fluid or gas plasma. These devices have been used by the military to detect magnetic anomalies and other magnetic signatures caused by submarines and ships. This device, even if the circuits used are solid state, is relatively large, requires a considerable amount of power, and is non-directional, measuring total magnetic field only.

A second device, which is most closely related to the present invention, was first described by Dr. Victor Vacquier U.S. Pat. No. 2,406,870. This phase shift magnetometer depends on the peculiar behavior of certain high permeability magnetic materials in a magnetic field.

Alloys having high permeability exhibit a unique hysteresis in their B-H curve. If two nearly identical coils containing this peculiar high permeability material are driven into saturation by an appropriate AC power supply, then voltages from the sensing coils produce unusual shaped wave forms. If these coils are wound in opposition and if an ambient magnetic field is applied to these coils, then the field and flux developed are increased in one core and decreased in another. Therefore, one coil will reach saturation slightly before the other yielding a net time shift in the distorted voltage signals with respect to one-another. This time shift, which is proportional to the level of ambient magnetic flux, is measured by a pair of secondary coils which subtract these voltages. This device had a sensitivity in the range of 0.5 nT.

A third device, also based upon the phase shift effect was designed in the 1950's by the Dinsmore Instrument Company. The system as designed by Dinsmore Instrument Company was used for anomaly measurement on auto and aircraft assembly lines. The compasses produced by the Dinsmore Instrument Company could be "adjusted" against the vehicle caused anomalies while on the assembly line.

The earlier Dinsmore Instrument device, and a later Dinsmore Instrument device which was the subject of an National Science Foundation grant, differed from the patent of Vacquier in that, these subsequent devices require only primary and not secondary coils for measurement of the magnetic field. Further these devices supply an additional electrical phase shift between the currents in the two coils, yielding a sensitivity as low as 0.01 nT.

A single magnetometer has a sensitivity of less than 1 pico Tesla. This device, referred to as the "Josephson Junction" device, predicts the passage of paired electrons, so-called Cooper Pairs, through a weak connection sandwiched between superconducting materials. A Josephson Junction in the presence of a magnetic field induces a current and subsequently draws voltage across a parallel pair of Josephson Junctions. The voltage drop across the paired Josephson Junctions is utilized as a measure of a magnetic anomaly or ambient magnetic field. Although this device is extremely sensitive, it requires a cryogenic environment. A recent advance in this field is a Superconducting Quantum Interference Device (or so-called "SQUID"), a Josephson Junction produced with relatively high temperature superconducting compounds. Resolution in the range of 0.00001 nano Teslas (or 0.01 picoTesla) have been reported. However, these so-called "high temperature superconducting compounds" must still be maintained at in a bath of liquid helium at near absolute zero temperatures.

Hence, at present, there is only one magnetometer which is capable of measuring magnetic field strengths at a level of one pico Tesla or below. This device is large and expensive since, among other reasons, it relies upon a superconducting material which must be maintained at cryogenic conditions. This is a serious drawback which makes the device unsuitable for many applications.

SUMMARY OF THE INVENTION

The present invention comprises a mirror image differential induction amplitude magnetometer (MIDIAM) which can obtain a sensitivity of less than 1 pico Teslas in an apparatus which has the properties of low cost, low power consumption, small size, and low weight.

The present invention consists of three parts. The first is a power supply which generates a suitable wave form with sufficient power to saturate the measuring sensor. The second part is the measuring sensor, comprising a pair of closely matched coils with high permeability cores of suitable size and configuration so as to be easily driven into saturation. The third part of this magnetometer system consists of the actual detection circuit. The output from the detection circuit is a shaped voltage pulse that can be conditioned to match an analog or digital readout or used directly for microprocessing.

The power supply saturates the cores of the coils which develop a distortion spike at saturation. The changes in the amplitude of this distortion spike are used to form a resultant voltage pulse which is transformed into a measure of the ambient magnetic field.

A novel limiting circuit is used to extract the magnetic field signal from the resultant voltage pulse. Integration and feedback methods are used in conjunction-with a third coil to cancel the magnetic flux in the first two coils to provide a linear response.

The objects, features, and advantages of the present invention are readily apparent from the following detailed description of the best mode for carrying out the invention when taken in connection with the accompanying drawings.

BRIEF DESCRIPTION OF THE DRAWINGS

FIG. 8 is a graph of the transfer characteristic of a novel limiting circuit.

FIG. 9 is a combination block-diagram and schematic-diagram of alternative embodiment of the magnetometer apparatus with closed-loop feedback.

While the invention will be described in connection with a prefered embodiment, it will be understood that it is not intended to limit the invention to that embodiment. On the contrary, it is intended to cover all alternatives, modifications and equivalents as may be included within the spirit and scope of the invention as defined by the appended claims.

BEST MODE OF CARRYING OUT THE INVENTION

Figure 1:
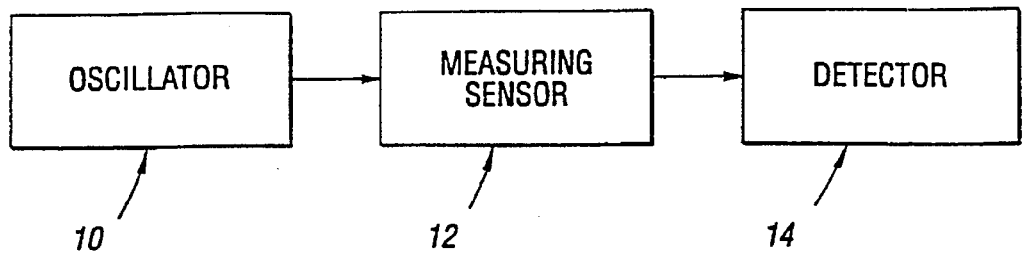
FIG. 1 is a block diagram of the magnetometer apparatus.

Turning first to FIG. 1, the present invention contains three basic parts: an oscillator 10; a measuring sensor 12; and a detector 14. The oscillator 10 serves to drive the sensor 12, consisting of a pair of coils.

Figure 2:
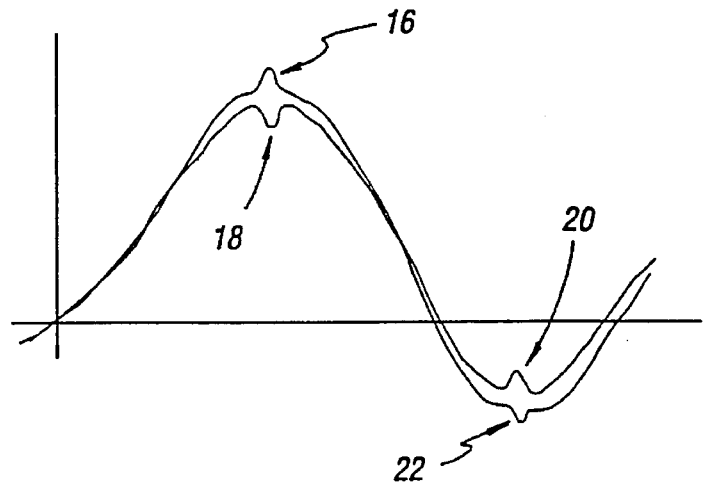
FIG. 2 is a representation of the back emf signal from the coils particularly indicating the distortion spikes.

As shown in FIG. 2, the pair of coils are driven into saturation causing a peculiar distortion spike in the back emf of each of the coils as represented by 16 and 18 in the positive half-cycle and as 20 and 22 during the negative half-cycle.

Figure 3:
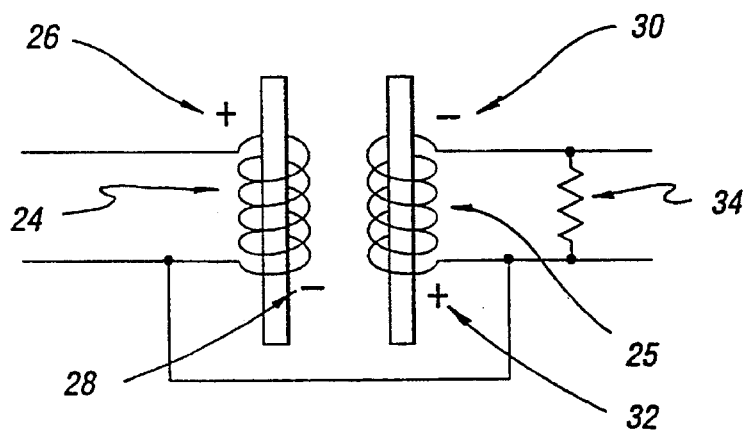
FIG. 3 is a schematic diagram of the connection of the coils.

Turning to FIG. 3, the measuring sensor comprises a first coil 24 and second coil 25 and wound on a core of Hy-mu 80, a high permeability core material. The cores in the preferred embodiment are 0.014 inches thick by 0.125 inches wide by 1.5 inches long. Fourteen-hundred turns of 40 gauge wire (wire with a diameter of 0.0031 inches with 0.0002 inches of insulation on each side)are wound on the center 0.75 inches of the core by length, in seven layers of 200 turns, each turn being separated by a layer of tape. Standard materials such as Hypernik, Mu Metal and Per-malloy could be used as well as a range of high permeability alloys which have been recently developed. It is believed that the potential sensitivity of the device could be enhanced by the use of such materials provided that similar distortion spikes are produced.

FIG. 3 also presents the physical and electrical orientation of the two coils. The electrical sense of the windings of coil 24 is denoted by plus sign 26 and minus signs 28. The characteristic electrical sense of the windings of coil 25 is denoted by minus sign 30 and plus sign 32. The two coils 24 and 25 are positioned substantially in parallel such that the plus end 26 of the coil 24 is adjacent to the minus end 30 of said coil 25 and the minus end 28 of coil 24 is adjacent to the plus end 32 of coil 25. Coil 24 is electrically connected to coil 25 with the plus end 32 of coil 25 being coupled to the minus end 28 of coil 24. A resistor 34 is placed in parallel with coil 25 to increase the sensitivity of the apparatus. With the coils balanced such that each coil represents nearly a mirror image of the other, the addition of resistor 34 results in more pronounced distortion spikes in the back emf of the coils during the saturation of the core material.

Figure 4:
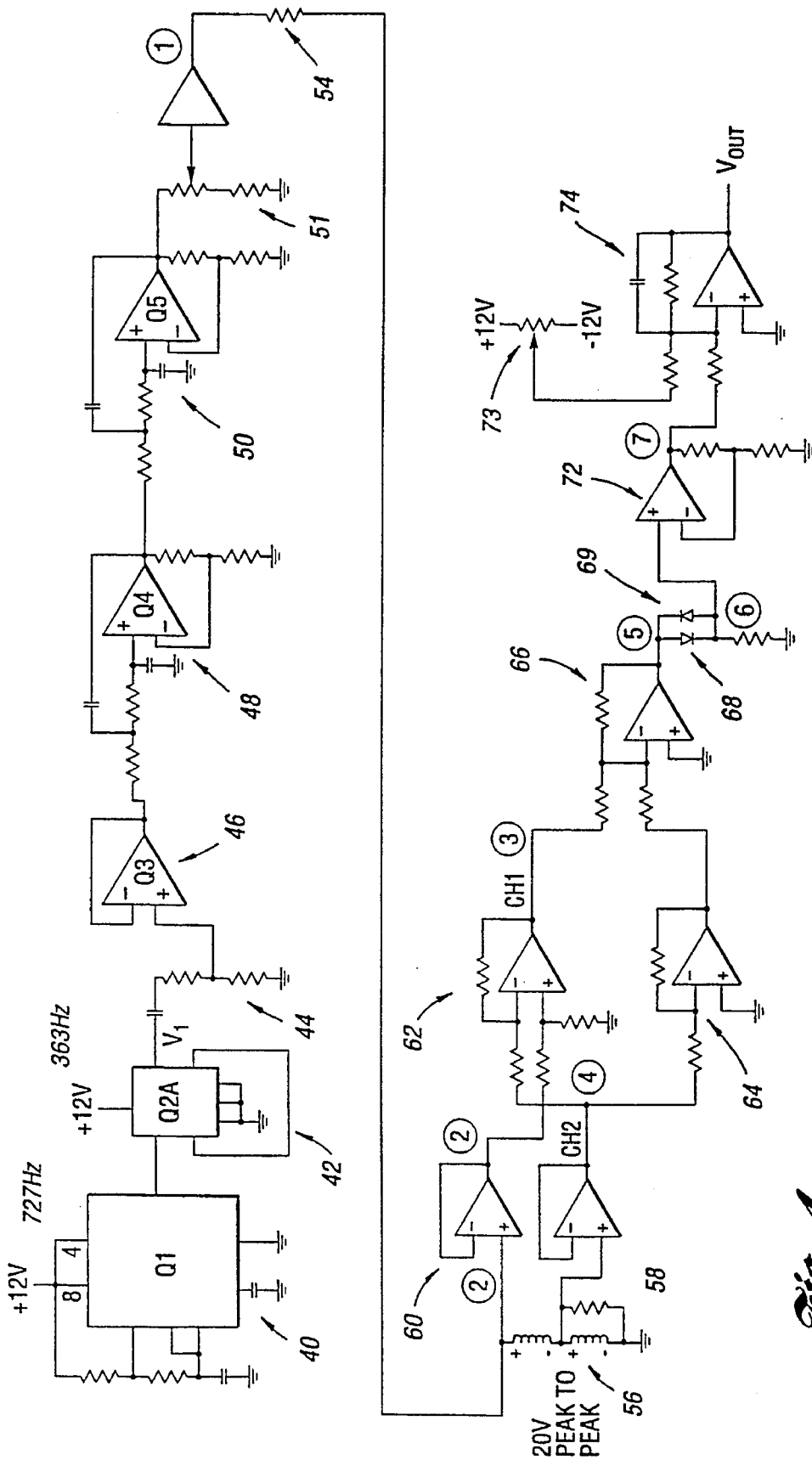
FIG. 4 is a schematic diagram of one embodiment of the magnetometer apparatus.

Turning now to FIG. 4, a timer chip 40 is connected in an astable multi-vibrator configuration. This chip generates square wave pulses at approximately 727 Hz with a fifty-percent duty cycle. These pulses are fed to flip flop 42 which is connected as a divide by two, frequency divider. Hence, the output is a series of square wave pulses of frequency 363 Hz. This series of pulses are input to a voltage divider network with a gain of approximately two-thirds, which attenuates the amplitude of the pulses by a factor of one-third and is AC coupled by a 0.1 micro Farad capacitor. This yields a low pass filter whose corner frequency is approximately 600 Hz which serves to attenuate the harmonics of the square wave pulses, while passing the fundamental frequency.

The signal is input to operational amplifier 46, configured as a noninverting buffer and then input two substantially identical second-order low pass filters 48 and 50, with a cut off frequency of approximately 410 Hz. These two second-order filters combine to form a fourth-order low pass filter with a cutoff frequency which is slightly less than 410 Hz. These filters pass the fundamental frequency of the train of pulses, yet they attenuate each of the harmonics of to form an output which is substantially sinusoidal in nature.

The output of this filter is fed to a resistive voltage-divider network 51. This network attenuates the output of the signal and is adjustable to provide saturation of the coils. The output of the voltage divider network is fed to high output current operational amplifier 52. In a prototype system, a peak current of around fifty milliamps is needed to drive the given cores into saturation. The amount of current required for saturation would vary based upon the number of wire turns and the permeability and cross-sectional area of the core.

The output of this high current operational amplifier is fed through a 47 Ohm resistor 54 to drive the two coil sensor, configured in a manner as previously described. This resistor provides isolation between the operational amplifier output and the coils to allow the back emf of the coils to exhibit the particular distortion during saturation as previously described. Alternatively, a coupling transformer could serve the same purpose.

The voltage drop across coils 24 and 25 are buffered via two operational amplifiers 58 and 60, each connected in a non-inverting buffer configuration. The buffered voltage across the second coil is subtracted from the buffered voltage across both coils via subtraction circuit 62 to form a voltage signal which is in proportion to the voltage drop across the first coil, only. The voltage drop across the second coil is then inverted via operational amplifier circuit 64 with a gain of one connected in the inverting configuration and then added via summing circuit 66 with the non-inverted voltage drop across the first coil. This effectively creates the difference between these two voltages.

This difference signal is fed to two diodes 68 and 69 which are connected in parallel. One of said diode's cathode is connected to the input, the other of said diodes is connected in a reverse fashion with its anode connected to the input. The output of these two diodes is coupled via resistor 70 to ground. This diode resistor combination serves to clip portions of the voltage signal which is below three-tenths of a volt. This clipping signal is fed to a high gain operational amplifier circuit 72 which is connected in the non-inverting configuration.

The amplified signal is fed to low-pass filter circuit 74 which has as a second input, an adjustable voltage fed from 10K potentiometer 73. This adjustable d.c. voltage serves as a second input to calibrate with the filter with respect to ground. The output of this filter is hence a d.c. level in proportion to the d.c. value of the clipped pulses.

Figure 6:
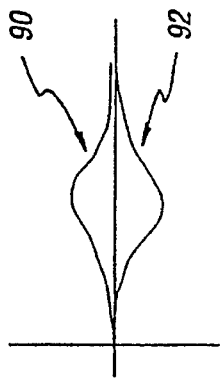
FIG. 6 is an expanded view of the distortion spikes which occur in the back emf of the two coils in the presence of a low amplitude magnetic field.

In the absence of any applied magnetic field in the east-west direction, the positive and negative half cycles of the sinusoid will produce distortion spikes that have identical amplitudes but opposite polarities. If the magnetic field is introduced, the amplitude of the distortion spike increases as shown in an expanded view of the positive half-cycle as pulses 80 and 82 in FIG. 5. As the magnetic field decreases, likewise the amplitude of the distortion decreases as shown in an expanded view of the positive half-cycle as pulses 90 and 92 in FIG. 6. Likewise, the pulses vary similarly during the negative half-cycle if similarly driven to saturation. The amplitude of the distortion spikes is isolated by subtracting the back emf of the two coils and by further processing by the detector, 14, to generate a signal in proportion to the magnitude and direction of the ambient magnetic field.

Figure 7:
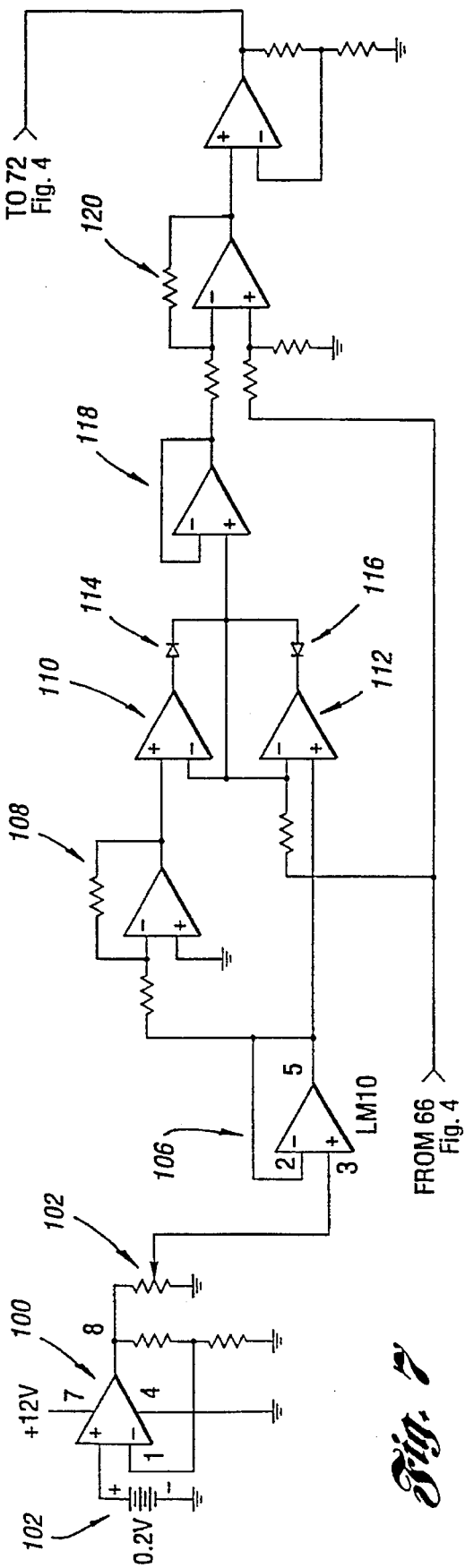
FIG. 7 is a schematic diagram of a novel limiting circuit for use in an alternate embodiment of the magnetometer apparatus.

FIG. 7 presents a variation of the circuit in FIG. 4 whereby limiting circuit comprising diodes 68 and 69 and resistor 70 is replaced by a more precise operational amplifier circuit. This novel limiting circuit is, in effect, a circuit which responds to an arbitrary input voltage $V_i$ with an output voltage, $V_o$ according to the transfer characteristic given in FIG. 8. In mathematical terms, the output voltage is given by $$V_o=(V_i-V_{t1})+V_r, \text{ for } V_i>V_{t1}$$

$$V_o=(V_i-V_{t2})+V_r, \text{ for } V_i<V_{t2}$$

$$V_o=V_r, \text{ for } V_{t2}<V_i<V_{t1}$$

where $V_{t1}$ is a first threshold voltage, $V_{t2}$ is a second threshold voltage, and $V_r$ is a reference voltage.

In the embodiment of FIG. 4, this limiting function was provided simply by diodes 68 and 69, and resistor 70 such that $V_{t1}$=0.3 volts, $V_{t2}$=−0.3 volts and $V_r$=0. The present embodiment allows for more freedom in the choice of these constants.

Figure 5:
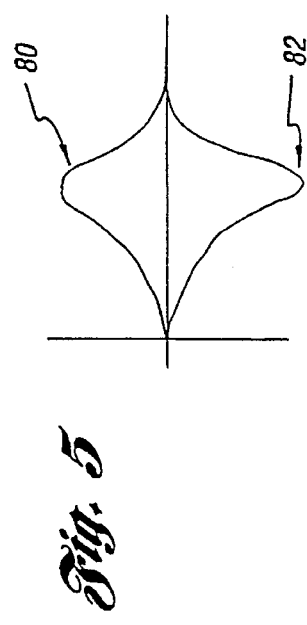
FIG. 5 is an expanded view of the distortion spikes which occur in the back emf of the two coils in the presence of a high amplitude magnetic field.

Turning to FIG. 5, the first and second threshold voltages are generated based upon reference voltage 102. This voltage is amplified by a factor of three by operational amplifier 100 connected in the noninverting configuration. The output of the amplifier is fed to potentiometer 104 which serves as a variable voltage divider which allows an adjustment in the value of this reference. This reference voltage is fed to buffer circuit 106 and, in turn, to inverting buffer 108. The voltage before and after the inverting buffer form the two threshold voltages, $V_{t1}$ and $V_{t2}$.

The two threshold voltages are fed to a circuit consisting of operational amplifiers 110 and 112 and diode 114 and 116. The input of this circuit can be called $V_i$ as previously defined. This circuit serves to pass all voltages $V_i$ where $V_{t2}<V_i<V_{t1}$, to limit all voltages $V_i<V_{t2}$ to a value of $V_{t2}$, and to limit all voltages. $V_i>V_{t1}$ to a value of $V_{t1}$. The resulting voltage signal is buffered via noninverting buffer 118 and subtracted from $V_i$ via differencing amplifier 120 to form the desired signal, $V_o$.

The first two embodiments described previously present highly sensitive apparatus for the measurement of magnetic fields. However, the measurements are linear only when the additional flux or applied magnetic field is small. Once the ambient field saturates the cores, then any additional ambient or external field has no effect. For anomalous measurements this situation may be adequate since only minuscule changes in the field are of concern and the absolute value of the magnetic field is immaterial. However, these embodiments may not be suitable for some applications where a both high and low field intensities are to be measured and where a linearity of response is desired.

In response to this shortfall, a third embodiment of the apparatus is presented in FIG. 9. This embodiment contains a complete apparatus as described in either of the first two embodiments in addition to closed-loop feedback circuitry to generate an additional magnetic field via a third coil to cancel the field in the two coils in the original sensor. This feedback configuration allows the detector to operate at output voltage which is maintained at a value near zero. This has the effect of providing an output from the integrator which is linearly proportional to the amount of field necessary to cancel the ambient field in the coils and thus is an excellent measure of that ambient field.

This embodiment is comprised of oscillator 130, power amplifier 132, sensing coils 128, and detector 134 as in the first two embodiments. The output signal 136 is integrated by operational amplifier circuit 121 which contains output current augmentation transistors 122. This integrated signal is fed, via source resistance 124 to a third coil 126 which is either wound so as to encircle the cores of the two original coils or placed in some other configuration so as to provide field cancellation in these coils.

The above narrative covers the preferred embodiments of the present invention. The circuitry was designed with many adjustments so it could be used in further identifying the response characteristics of the sensor, the core, the display, the magnetic field, and any other possible variation that could be theorized and subsequently, quantified. A final circuit might not have any of these elaborate adjustments.

The sensitivity of the apparatus has been determined to be less than 1 pico Tesla. Experiments were conducted in conjunction with the Naval Surface Warfare Laboratories. A 1000 nano Tesla field produced a response of 5.0 volts in the new instrument. This field did not produce saturation of the instrument and thus was still within the range of linear response. Since the circuit is able to resolve a field producing a 1 micro volt change, a sensitivity of 0.5 pico Teslas is implied.

The current circuitry was designed to develop sufficient power, for what we would consider to be an extremely oversized coil sensor. The core section of the sensor has an $H_r$ that runs from two to five. Many modern high permeability materials have an $H_r$ below 0.010. For example, Carpenter technology Corporation produces high permeability nickel alloys with an $H_r$ of 0.01 to 0.008. The net sensitivity of the apparatus could be improved by the introduction of these materials.

While the best mode for carrying out the invention has been described in detail, those familiar with the art to which this invention relates will recognize various alternative designs and embodiments for practicing the invention as defined by the following claims.

What is claimed is:

1. A magnetometer comprising:

a first electrical coil and a second electrical coil each having a windings about a core, said windings having a characteristic sense defined by a plus end and a minus end, said first coil positioned substantially in parallel with said second coil such that the plus end of said first coil is adjacent to the minus end of said second coil, said first coil electrically connected to said second coil with the plus end of said first coil being coupled to the minus end of said second coil;

an oscillator for generating a periodic signal which drives each coil into magnetic saturation during a portion of the period of said periodic signal, said coils having a back emf signal being responsive to said periodic signal and to an ambient magnetic field present in said coils, said back emf signal exhibiting a distortion which varies in amplitude with said ambient magnetic field present in said coils;

a comparator for comparing the back emf signal of said first coil to the back emf signal of said second coil to generate a comparison signal; and a detector for determining the magnetic field present at said first coil and said second coil in response to said comparison signal and for producing an output signal, $X_o$ defined by:

$$X_o=(X_i-X_{t1})+X_r \text{ for } X_i>X_{t1}$$

$$X_o=(X_i-X_{t2})+X_r \text{ for } X_i<X_{t2}$$

$$X_o=X_r \text{ for } X_{t2}<X_i<X_{t1}$$

where $X_i$ is said comparison signal, $X_{t1}$ is a first threshold signal, $X_{t2}$ is a second threshold signal, $X_r$ is a reference signal.

2. The magnetometer of claim 1 wherein said oscillator generates a periodic signal which is substantially sinusoidal and where each of said coils is driven into saturation during both the positive and negative half-cycles of said signal.

3. A circuit for providing an output voltage, $V_o$ such that:

$$V_o=(V_i-V_{t1})+V_r \text{ for } V_i>V_{t1}$$

$$V_o=(V_i-V_{t2})+V_r \text{ for } V_i<V_{t2}$$

$$V_o=V_r \text{ or } V_{t2}<V_i<V_{t1}$$

where $V_i$ is an arbitrary input voltage, $V_{t1}$ is a first threshold voltage, $V_{t2}$ is a second threshold voltage, and $V_r$ is a reference voltage, said circuit comprising:

a threshold voltage generator for generating said first and second threshold voltages;

first and second operational amplifiers having inverting and noninverting inputs where said first threshold voltage is fed to the noninverting input of said first operational amplifier and said second threshold voltage is fed to the noninverting input of said second operational amplifier and the inverting inputs of said first and second operational amplifiers are directly connected;

a first diode having a cathode and an anode where said cathode is connected to the output of said first operational amplifier and said anode of said first diode is connected to the inverting input of said first operational amplifier;

a second diode having a cathode and an anode where said anode is connected to the output of said second operational amplifier and said cathode of said second diode is connected to the inverting input of said second operational amplifier said first and second operational amplifiers and said first and second diodes being responsive to said input voltage and said first and second threshold voltages to generate a limiting voltage on the connection between the inverting inputs of said first and second operational amplifiers; and a comparator which is operative to subtract said limiting voltage from said input voltage to obtain said output voltage.

4. A magnetometer as in claim 1 wherein said detector includes a signal generator for producing said first and second threshold signals.

5. A magnetometer as in claim 4 wherein said output signal includes a d.c. bias and said detector further includes a filter for extracting said bias from said output signal and for producing a magnetic field signal having a magnitude proportional to the magnitude of the magnetic field present at said first and second coils and having polarity indicative of the magnetic field at said first and second coils.

6. A magnetometer as in claim 5 herein said comparator is operative to subtract the back emf from said first coil from the back emf from said second coil.

7. A magnetometer as in claim 3 wherein said circuit further includes an input resistor coupling said input voltage to the inverting inputs of said first and second operational amplifiers.

8. A magnetometer comprising:

an oscillator for generating a periodic signal;

a sensor in electrical connection with said oscillator, said sensor comprising first and second coils each having windings about a core, said windings having a characteristic sense defined by a plus end and a minus end, said first coil positioned substantially in parallel with said second coil such that the plus end of said first coil is adjacent to the minus end of said second coil, said first coil electrically connected to said second coil with the plus end of said first coil being coupled to the minus end of said second coil, said coils being driven into magnetic saturation during a portion of the period of said periodic signal, said first and second coils each having back emf signals responsive to said periodic signal and to an ambient magnetic field in said first and second coils, said back emf signals each exhibiting a distortion spike which varies in amplitude with said ambient magnetic field in said first and second coils;

a detector for sensing each of said back emf signals on said first and second coils; and a comparator which is responsive to each of said emf signals to generate an output signal which is proportional to the strength of said ambient magnetic field present at said first coil and said second coil.

9. A magnetometer as in claim 8, wherein said comparitor is operative to subtract the back emf signal of one of said first and second coils from the back emf signal of the other of said first and second coils to generate a difference signal; and further wherein said comparitor is responsive to said difference signal to generate said output signal.

10. A magnetometer as in claim 8 wherein said detector produces an output signal, $X_o$ defined by:

$$X_o=(X_i-X_{t1})+X_r \text{ for } X_i>X_{t1}$$

$$X_o=(X_i-X_{t2})+X_r \text{ for } X_i<X_{t2}$$

$$X_o=X_r \text{ for } X_{t2}<X_i<X_{t1}$$

where $X_i$ is said difference signal, $X_{t1}$ is a first threshold signal, $X_{t2}$ is a second threshold signal, $X_r$ is a reference signal.

11. A magnetometer as in claim 10 wherein said detector includes a generator for producing said first and second threshold signals.

12. A magnetometer as in claim 11 wherein said output signal includes a d.c. bias and said detector further includes a filter for extracting said bias from said output signal and for producing a magnetic field signal having a magnitude proportional to the magnitude of the magnetic field present at said first and second coils and having polarity indicative of the magnetic field at said first and second coils.

13. A magnetometer as in claim 8 further including the following:

a third coil, having windings in close proximity to said first and second coils for supplying additional magnetic field to said first and second coils;

an integrator for integrating the output signal from said detector and generating an integrated output signal; and a coupling connecting said integrator to said third coil, said coupling operable to drive said third coil in response to said integrated output signal to cancel some or all of said ambient magnetic field.

14. A magnetometer as in claim 13 wherein said third coil includes windings which are wound so as to encircle the cores of said first and second coils.

15. A magnetometer as in claim 8 further including a resistor connected in parallel with one of the first and second coils.

16. A magnetometer comprising:

an oscillator for generating a periodic signal with first and second half cycles and a period T;

a sensor in electrical connection with said oscillator, said sensor comprising first and second coils each having windings about a core, said windings having a characteristic sense defined by a plus end and a minus end, said first coil positioned substantially in parallel with said second coil such that the plus end of said first coil is adjacent to the minus end of said second coil, said first coil electrically connected to said second coil with the plus end of said first coil being coupled to the minus end of said second coil, wherein said first and second coils each have back emf signals responsive to said periodic signal and to an ambient magnetic field in said first and second coils, said back emf signals each exhibiting a distortion spike which varies in amplitude with said ambient magnetic field in said first and second coils;

a comparator for comparing the back emf signal of said first coil to the back emf signal of said second coil to generate a comparison signal; and a detector which is responsive to the comparison signal to determine the strength of the magnetic field present at the first coil and generating an output signal, $X_o$, proportional to the strength of the magnetic field, said output signal, $X_o$, being defined by:

$$X_o=(X_i-X_{t1})+X_r \text{ for } X_i>X_{t1}$$

$$X_o=(X_i-X_{t2})+X_r \text{ for } X_i<X_{t2}$$

$$X_o=X_r \text{ for } X_{t2}<X_i<X_{t1}$$

where $X_i$ is said comparison signal, $X_{t1}$ is a first threshold signal, $X_{t2}$ is a second threshold signal, $X_r$ is a reference signal, said output signal having a d.c. bias, said detector including a threshold voltage generator for generating said first and second threshold voltages and a filter for extracting said bias from said output signal and for producing a magnetic field signal having a magnitude proportional to the magnitude of the magnetic field present at said first and second coils and having polarity indicative of the direction of the magnetic field at said first and second coils.

17. A magnetometer comprising:

an oscillator for generating a periodic signal;

a sensor in electrical connection with said oscillator, said sensor comprising first and second coils each having windings about a core, said windings having a characteristic sense defined by a plus end and a minus end, said first coil positioned substantially in parallel with said second coil such that the plus end of said first coil is adjacent to the minus end of said second coil, said first coil electrically connected to said second coil with the plus end of said first coil being coupled to the minus end of said second coil, wherein said first and second coils each have back emf signals responsive to said periodic signal and to an ambient magnetic field in said first and second coils, said back emf signals each exhibiting a distortion spike which varies in amplitude with said ambient magnetic field in said first and second coils;

a resistor connected in parallel with one of said first and second coils;

a comparator for comparing the back emf signal of said first coil to the back emf signal of said second coil to generate a comparison signal; and a detector which is responsive to the comparison signal to determine the strength of said magnetic field present at said first coil and the second coil.

* * * * *